United States Patent [19]

Martin et al.

[11] Patent Number: 4,919,900
[45] Date of Patent: Apr. 24, 1990

[54] SYSTEM FOR CRYSTAL GROWTH, PARTICULARLY FOR SPACE VESSEL

[75] Inventors: Gérard M. Martin, Valenciennes; Manuel P. Claramonte, Chaville; Jean-Claude Auffret, Chapet; Guy M. Bonnet, Poissy; Jean-Jacques Delarue, Velizy Villa-Coublay, all of France

[73] Assignee: Aerospatiale Societe Nationale Industrielle, Paris, France

[21] Appl. No.: 274,052
[22] PCT Filed: Mar. 3, 1988
[86] PCT No.: PCT/FR88/00121
§ 371 Date: Oct. 3, 1988
§ 102(e) Date: Oct. 3, 1988
[87] PCT Pub. No.: WO88/06648
PCT Pub. Date: Sep. 7, 1988

[30] Foreign Application Priority Data

Mar. 4, 1987 [FR] France ............................... 87 02947

[51] Int. Cl.[5] ........................ B01D 9/00; C30G 29/54; C30G 35/00; C30B 7/00
[52] U.S. Cl. .................................. 422/245; 422/102; 422/236; 422/253; 156/607; 156/DIG. 62; 156/DIG. 113
[58] Field of Search .............. 422/245, 236, 102, 253; 156/DIG. 62, 608, 607, DIG. 113

[56] References Cited

U.S. PATENT DOCUMENTS 3,511,612  3/1967  Kennerly et al. .................. 422/236
3,788,818  1/1974  Madjid et al. ........................ 23/295
3,898,044  8/1975  Strecker et al. .................... 422/245
4,812,293  3/1989  McLaurin et al. .................. 422/102

OTHER PUBLICATIONS

Journal Crystal Growth, vol. 76, No. 3, Aug. 11, 1986, W. Little et al., "Protein Single Crystal Growth Under Microgravity", pp. 663-672.
AIAA Journal, vol. 16, No. 5, Mar. 78.
M. D. Lind: "Crystal Growth from Solutions in Low Gravity", pp. 458-462.

Primary Examiner—Gary P. Straub
Attorney, Agent, or Firm—Fisher, Christen & Sabol

[57] ABSTRACT

A system for crystallogenesis by diffusion, intended in particular for use on board a space ship, and in which a substance to be crystallized contained in a crucible (18) is brought into contact with a precipitating agent. This crystallogenesis system comprises: at least one receptable (4) in communication with the means for admitting the precipitating agent (2, 3,8,9,10,11) and the means for evacuating the precipitating agent (12, 13); at least one leakproof capsule (17) containing at least one such crucible (18) and filled with the precipitating agent, the said crucible containing at least one such crucible (18) and filled with the precipitating agent, the said crucible containing the said substance to be crystallized; and means of connection (5,6,7,23) which enable the interior of the said capsule (17) to be connected automatically to the said means for admitting (2,3,8,9,10,11) and to the said means for evacuating (12,13) the precipitating agent, when the said leakproof capsule (17) is introduced into the said receptable.

18 Claims, 4 Drawing Sheets

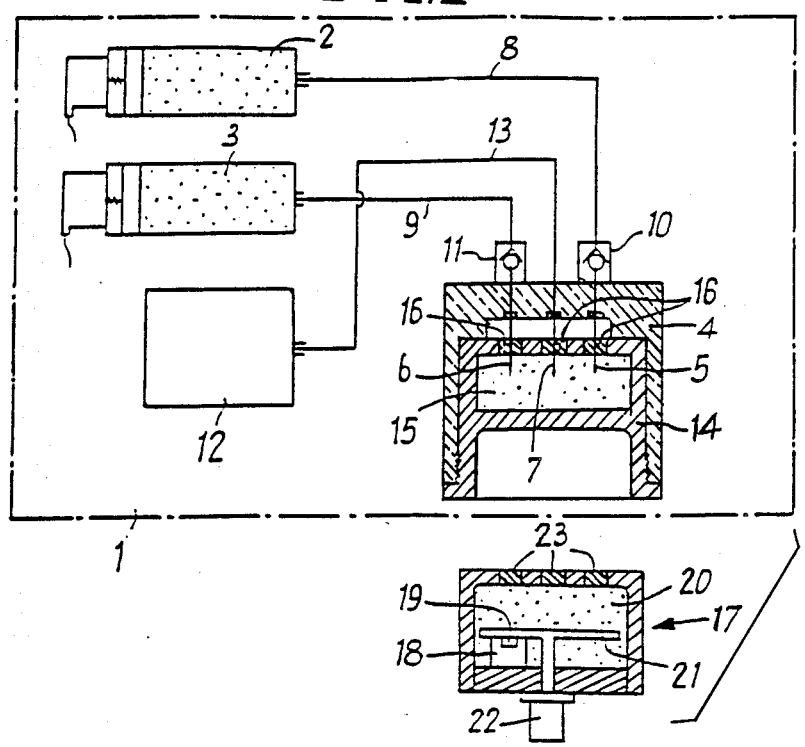
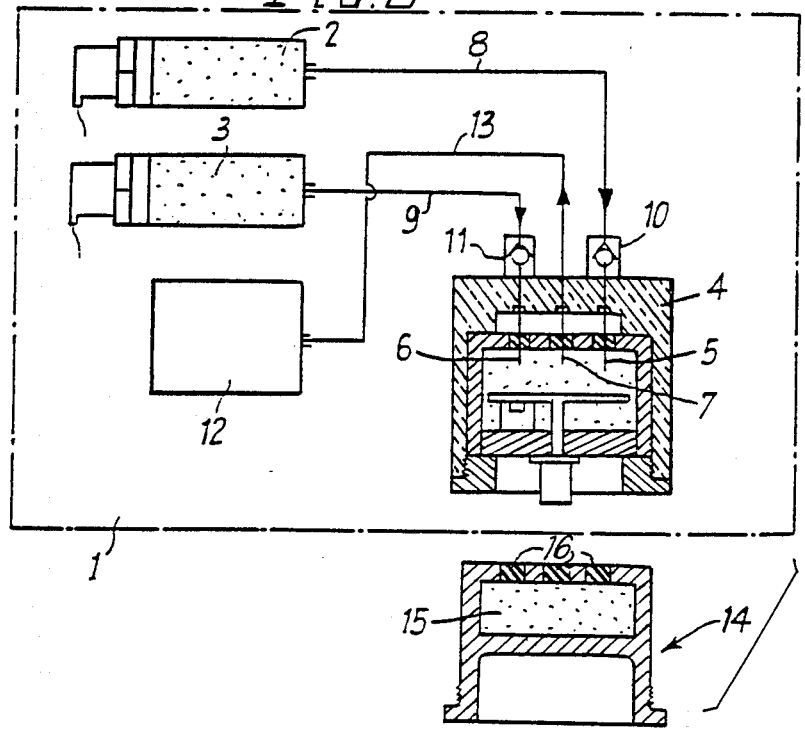

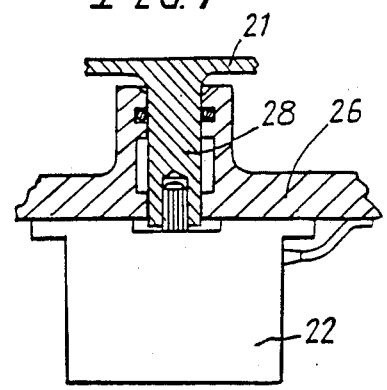
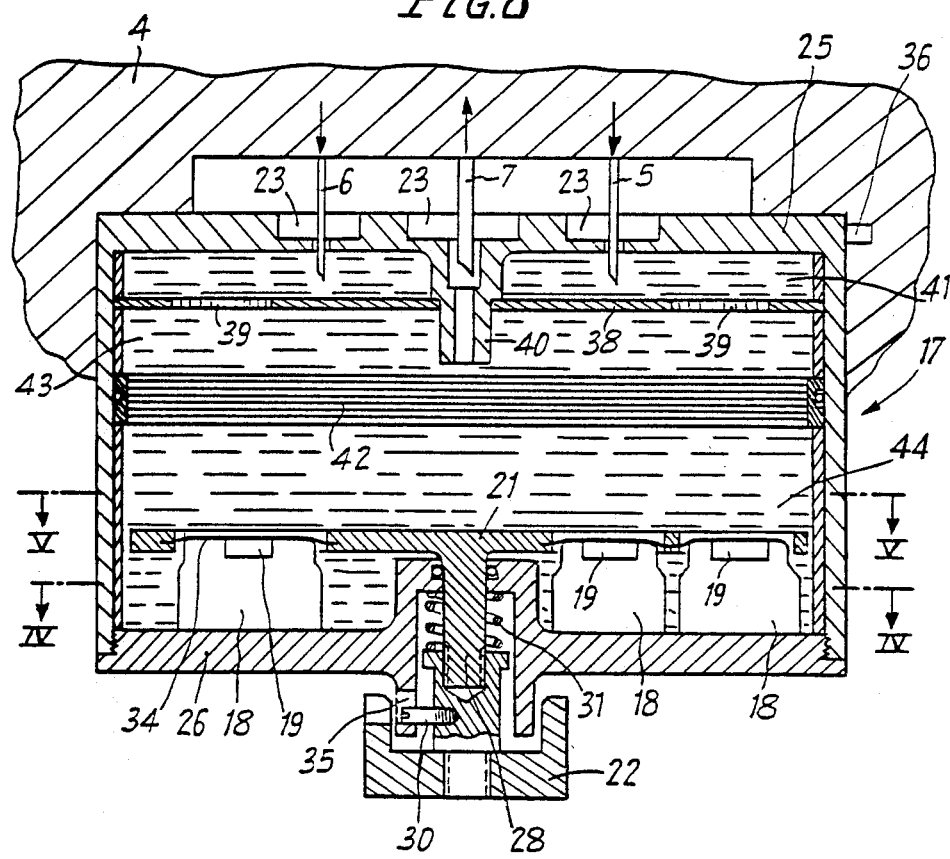

SYSTEM FOR CRYSTAL GROWTH, PARTICULARLY FOR SPACE VESSEL

The present invention relates to a system for crystal growth, especially but non-limitatively adapted to be employed on board a space vessel.

It is known that one of the methods of studying macromolecular substances consists in forming crystals of said substances and in subjecting said crystals to examinations, particularly spectrographic ones. In order to form such crystals, methods of diffusion, possibly through a porous diffusion wall, are used. To that end, in an enclosure, is disposed a crucible filled with a liquid mixture of a macromolecular substance to be studied and of a precipitating agent in an insufficient concentration to act, then such a precipitating agent is introduced into said enclosure either in vapour form or in liquid form.

By diffusion, the concentration of the mixture of the precipitating agent and of the macromolecular substance contained in the crucible tends to align on that of the precipitating agent contained in the enclosure. Consequently, by varying the concentration of this latter precipitating agent, one may act on the crystallization of said macromolecular substance. The crucible and the enclosure are generally at least partially transparent, with the result that an operator may visually follow the development of the crystallization.

However, the crystals obtained in laboratories on Earth by carrying out these diffusion techniques are not perfect, either in quality or in size, particularly due to the phenomena of convexion due to gravity.

In order to overcome this drawback, it would be advantageous to be able to employ such diffusion techniques on board space vessels, as, in that case, the conditions of zero-gravity eliminate these phenomena of convexion.

However, an attempt to employ the terrestrial methods as such would encounter difficulties, if not impossibilities, due in particular to the working conditions on board the space vessels and to the conditions of launching thereof, as well as to the short life duration of certain macromolecular substances (about fifteen days for proteins for example). For example, taking into account the imperatives and relatively long periods for preparing the launching of a space vessel, the macromolecular substances would be dead before crystallization thereof in space could be attempted.

The present invention has for its main object a system of crystal growth making it possible to adapt the methods of diffusion to use on board a space vessel, it being understood that this system may, however, be used in a laboratory on Earth.

To that end, according to the invention, the system of crystal growth by diffusion, particularly intended to be employed on board a space vessel, and in which a substance to be crystallized, contained in a crucible, is brought into the presence of a precipitating agent, is noteworthy in that it comprises:

at least one receptable in communication with means for supplying and means for evacuating precipitating agent;

at least one tight capsule enclosing at least one such crucible and filled with precipitating agent, said crucible containing said substance to be crystallized; and connecting means automatically connecting the interior of said capsule with said means for supplying and with said means for evacuating precipitating agent during introduction of said tight capsule in said receptacle.

It is seen that said receptacle, said means for supplying precipitating agent and said means for evacuating precipitating agent may form a fixed sub-assembly which contains the products without too considerable time limitations and which may be installed and positioned in a space station, even in the transport vehicle for placing in orbit, several weeks before the beginning of the experiments of crystal growth. On the other hand, the tight capsule or capsules, preferably modular, are easy to manipulate and may, after having been prepared in the laboratory, be embarked at the last moment by the astronauts and, moreover, be returned by them after the experiment.

Thus, thanks to the invention, a minimum period of time between the manufacture of the macromolecules to be studied and the beginning of the experiments of crystal growth in zero gravity may be obtained. Moreover, the invention makes it possible to reduce the transport costs of the flights both for the outward and return journey, costs which are connected with the volume and mass carried each time. Thanks to the fact that the tight capsule is filled with precipitating agent, any risk of contamination of the substance to be crystallized before positioning of said capsule in said receptacle, i.e. before the beginning of crystallization, is avoided. This precipitating agent filling the capsule before the beginning of the experiment of crystallization must present a sufficiently weak concentration to be inert vis-à-vis the substance to be crystallized, in order not to trigger off a beginning of crystallization. However, thanks to another particular feature of the invention described hereinafter, in certain cases where this is necessary, said precipitating agent initially introduced in the capsule may present a concentration which would render it active.

In an advantageous embodiment, said connecting means provided for automatically connecting the interior of the capsule with the supply and evacuation means, comprise, on the one hand, needles connected to said receptacle and, on the other hand, blocks of matter capable of being perforated in tight manner by said needles, said blocks being connected to said capsule. Such blocks, for example made of a polymer presenting considerable properties of elasticity, are generally known in the medical, pharmaceutical or biological techniques under the name of septum. Thanks to such connecting means, it is seen that said capsule is plugged, by its septa, on the needles of the receptacle. When such plugging is effected, it suffices to act on the means for supplying precipitating agent in order to introduce into said capsule a precipitating agent of desired concentration, which modifies the concentration of the precipitating agent initially present in the capsule and allows triggering off of crystallization. By monitoring the quantity and/or the concentration of the precipitating agent thus introduced, one has the possibility of acting on the crystallization of the substance contained in the crucible. Moreover, thanks to such plugging, precipitating liquid previously present in the capsule may be evacuated via said evacuation means under the pressure of the precipitating liquid introduced by said supply means. In this way, although the capsule has a constant volume and it is initially full, fresh precipitating agent may be introduced, the fresh precipitating agent introduced driving out an equal quantity of precipitating agent from the capsule. In order to collect the precipitating agent driven from the capsule, said evacuation means comprise an expansion vessel.

Said means for supplying precipitating agent preferably comprise at least one syringe. This syringe thus serves both as reservoir of precipitating agent and as means for injecting same into the capsule. Such a syringe may be of any known type and actuation of its piston may be manual or motorized. Whatever the nature of the actuation means, it is, however, important that they make it possible to know the quantity of precipitating agent injected. Several syringes containing precipitating agent at different concentrations are preferably provided. In this way, monitoring of the crystallization of the substance contained in the crucible is facilitated.

Advantageously, the system according to the invention comprises a plug which may be introduced into said receptacle in place of said capsule, said plug comprising a spongy body imbibed with precipitating agent and accessible to said needles of said connection means through the blocks (septa) fast with said plug and made of a matter capable of being perforated in tight manner by said needles. Such a stopper is positioned in the receptacle in place of said capsule before plugging thereof, and possibly after said capsule has emerged from said receptacle, particularly during the phases of transport, with the result that the needles may constantly be bathed by precipitating agent, which avoids any risk of contamination and obstruction.

Particularly in the case of several syringes being used, respectively containing precipitating agent at different concentrations, it is advantageous to provide non-return valves in said supply means. In this way, each supply circuit is isolated with respect to the others and undesirable mixtures of precipitating agent of different concentrations are avoided. These non-return valves are then disposed as close as possible to said needles.

It is known that the techniques of diffusion used in crystal growth are varied as far as the process of diffusion is concerned. One of the objects of the present invention is to design a capsule which is capable, without any modification or at least with a minimum of modifications, of being used whatever the process of diffusion employed (dialysis, liquid/liquid diffusion and liquid/vapour diffusion).

In this way, the users of the system according to the invention benefit from a considerable flexibility of experimentation and the costs of equipment and experiment are reduced.

To that end, it is advantageous if an obturator, controllable manually or via drive means, is provided inside said capsule, in order either to obturate said crucible in order to isolate its contents from the interior cavity of said capsule, or to clear said crucible in order to place its contents in communication with the latter cavity. In this way, when this is necessary for certain experimental purposes, it is possible to fill said capsule with precipitating agent at a concentration very close to the theoretical concentration for formation of the crystals, without prematurely starting off crystal growth, since in that case the obturator may isolate the crucible from the capsule. When the experiment must begin, it then suffices to pass said obturator, directly associated with the crucible, from its position of obturation to its position of clearance.

In an advantageous embodiment, said controllable obturator is a perforated disc mounted to rotate about a shaft accessible from outside the capsule. Rotation of said disc may be obtained manually or by the action of drive means. Whatever the mode of actuation of the disc, it is seen that said crucible is obturated when it lies opposite a solid part of the disc and, on the contrary, cleared when it lies opposite an orifice thereof.

In position of obturation of the crucible by the disc, the latter is applied on the edges of the opening of said crucible. In order to avoid the disc deteriorating by friction, in its movement, the possible membrane (necessary in diffusion by dialysis) covering the crucible, it is advantageous if said shaft of the rotating disc can slide in limited manner, parallel to its axis, so that said disc is moved apart from the crucible during passage of the disc from a position of obturation to a position of clearance, and vice versa.

In order further to eliminate the risk of deterioration of the possible dialysis membrane covering the crucible, it is provided that at least that part of the obturator coming into contact with the crucible in a position of obturation is constituted by a supple membrane.

A separating wall is preferably provided inside said capsule, between said connection means corresponding to said means for supplying precipitating agent and said connection means corresponding to said means for evacuating precipitating agent.

Moreover, in the case of a process of dialysis or of liquid/liquid diffusion, a diffusion surface may be provided, inside said capsule, between, on the one hand, said connection means to said means for supplying and evacuating precipitating agent and, on the other hand, said crucible.

In the case of a liquid/vapour diffusion, an element for retaining precipitating agent is advantageously provided, inside said capsule, between, on the one hand, said connection means to said means for supplying and evacuating precipitating agent and, on the other hand, said crucible. An additional controllable obturator is then preferably associated with said retention element; it may be connected in rotation to the controllable obturator associated directly with the crucible.

It is preferable if an intermediate chamber is arranged, in the capsule, between, on the one hand, the controllable obturator associated directly with the crucible, and, on the other hand, depending on the case, the diffusion surface or the retention element (or the additional controllable obturator).

The FIGS. of the accompanying drawings will clearly show how the invention may be carried out. In these FIGS., identical references designate like elements.

FIG. 1 illustrates, in simplified and schematic manner, a system according to the invention before, and possibly after, a crystal growth experiment.

FIG. 2 illustrates, similarly to FIG. 1, said system during a crystal growth experiment.

FIG. 6 is a partial view in the direction of arrow F of FIG. 3.

FIG. 7 illustrates a variant embodiment of the means for actuating the obturator disc.

FIG. 8 shows, in axial section, an advantageous embodiment for a capsule intended for diffusion in liquid phase.

Figure 3:
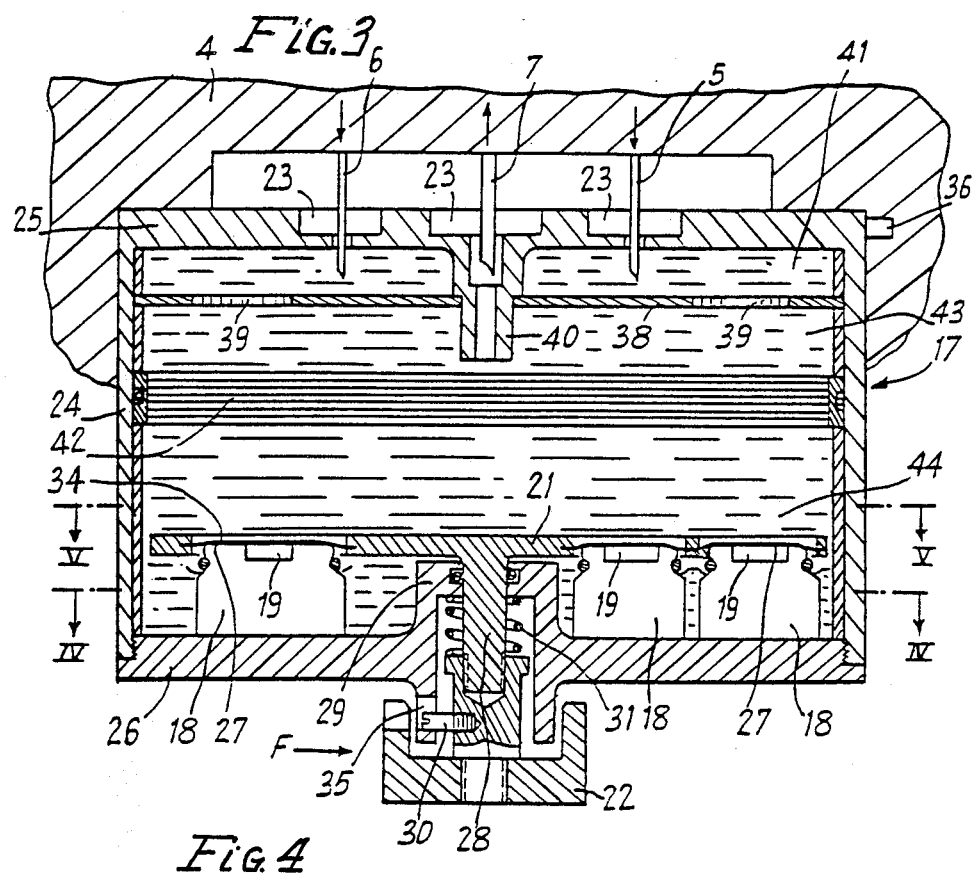
FIG. 3 shows, in axial section, an advantageous embodiment for a capsule intended for crystal growth by dialysis.

FIGS. 1 and 2 schematically indicate by a rectangle in chain-dotted lines, a thermostatted box 1 mechanically fast, for example, with the structure of a space station. This thermostatted box 1 does not form part of the scope of the present invention and may be made in any known manner.

Inside the thermostatted box 1 are mounted:

syringes 2 and 3 containing a precipitating agent at different concentrations;

a receptacle 4, for example in the form of an open box, and in the bottom of which are provided needles 5, 6 and 7;

pipes 8 and 9 respectively connecting the outlet of the syringes 2 and 3 to the needles 5 and 6, via non-return valves 10 and 11;

an expansion or overflow vessel 12 connected to the needle 7 via a pipe 13;

a plug 14 for the receptacle 4, comprising a spongy body 15 which is imbibed with precipitating agent and in which said needles 5, 6, 7 penetrate when said plug 14 is in position of obturation of said receptacle. To that end, the bottom of the plug 14 comprises blocks 16, made of a matter capable of being perforated in tight manner by said needles 5, 6 and 7 which may thus attain the spongy body 15.

Furthermore, the system according to the invention shown in FIGS. 1 and 2 comprises a tight capsule 17 enclosing at least one crucible 18, in the cavity 19 of which may be introduced a mixture of a macromolecular substance to be crystallized and of precipitating agent at an inactive concentration. The inner cavity 20 of the tight capsule 17 is filled with precipitating agent. The cavity 19 of the crucible 18 may be isolated from or, on the contrary, placed in contact with the precipitating agent contained in the cavity 20 of the capsule 17, thanks to a mobile obturator 21 moved by an actuation member 22. One wall of the tight capsule 17 comprises blocks 23, similar to blocks 16 of the plug 14, made of a matter capable of being perforated in tight manner by the needles.

The outer shapes of the plug 14 and of the tight capsule 17 are such that they are interchangeable inside the receptacle 4.

When, as shown in FIG. 1, the plug 14 is in place inside the receptacle 4, the capsule 17 is physically independent of the assembly constituted by elements 2 to 16. It is therefore possible to mount in a space station said assembly 2 to 16 which contains only substances of relatively long life duration, a long time before loading, at the place of its manufacture, the macromolecular substance to be crystallized in the crucible 18. In this way, all the preparations of the experiments of crystal growth other than those concerning the substance to be crystallized, may be terminated or in the course of being finished, when the capsule 17 physically approaches the assembly 2 to 16, with a view to a crystallization experiment.

When the conditions of this experiment are combined, the plug 14 of the receptable 4 is removed and it is replaced by the capsule 17 (cf. FIG. 2). The needles 5, 6 and 7 then pass through the blocks 23 and therefore open out into the interior cavity 20 of the capsule 17. By acting on the syringes 2 and 3 (manually or via a motor), there are injected into this cavity 20 known quantities of precipitating agent at concentrations different from that which pre-existed in the capsule 17. The concentration of the precipitating agent initially contained in the capsule 17 is therefore modified and, if the obturator 21 is cleared, one acts on the crystallization of the macromolecular substance contained in the cavity 19 of the crucible 18. The excess of precipitating agent injected in the capsule 17 is evacuated via pipe 13 towards the overflow vessel 12.

Finally, when the crystallization experiment is finished, the capsule 17 is removed from the receptacle 4 and replaced by plug 14 (FIG. 1). The capsule 17 may then be taken to any desired place for study of the crystals obtained.

Figure 4:
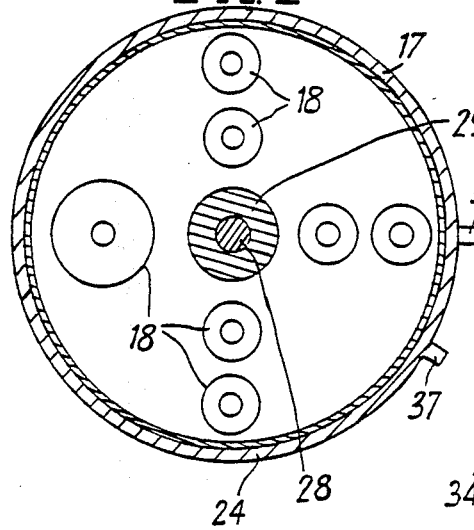
FIG. 4 is a transverse section, on a reduced scale, along line IV—IV, respectively of FIGS. 3, 8 and 9.
Figure 5:
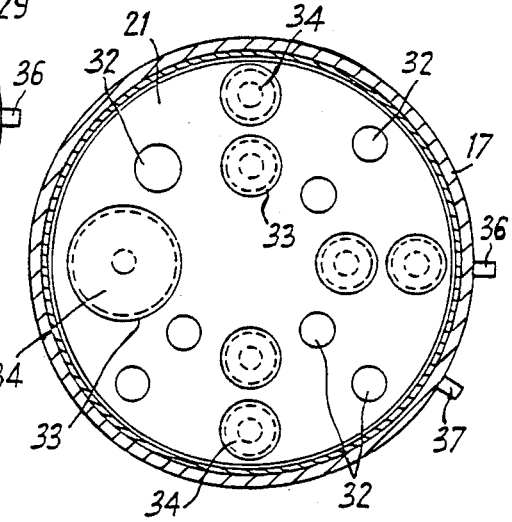
FIG. 5 is a transverse section, on a reduced scale, along line V—V, respectively, of FIGS. 3 and 8.

FIGS. 3, 4 and 5 show an advantageous embodiment for a capsule 17, more particularly intended for crystal growth by dialysis. This capsule 17 comprises a body 24, for example cylindrical, obturated by a bottom 25, in which are provided elastic blocks 23, and by a bottom 26 bearing a plurality of crucibles 18. Each of said crucibles 18 is obturated by a dialysis membrane 27.

The rotating obturation disc 21 is fast with a shaft 28 able to rotate and slide in a bearing 29, fast with the bottom 26. Moreover, the shaft 28 bears a catch 30, applied by a spring 31, disposed between said bottom 26 and said disc 21, against a ramp 35 fast with the bottom 26.

The obturation disc 21 is provided with a plurality of open orifices 32 and with a plurality of orifices 33, obturated by a supple membrane 34. The number and arrangement of the orifices 32 and 33 are such that, for a first angular position of the disc 21, all the orifices 32 lie opposite openings 19 of all the crucibles 18 and that, for a second angular position of the disc 21, all the membranes 34 are in abutment against the edges of the cavities 19 and against all the dialysis membranes 27 of all the crucibles 18 (position shown in FIG. 5).

To pass from one of these positions to the other, it suffices to rotate the shaft 28, either manually (FIG. 3) or with the aid of a motor (FIG. 7). In the course of rotation, thanks to the cooperation of the catch 30 and of the ramp 35 under the action of the spring 31, the disc 21 is raised, which avoids deterioration by friction of the dialysis membranes 27.

The body 24 of the capsule 17 comprises an indexing catch 36 making it possible, by cooperation with a complementary element (not shown) of the receptacle 4, to guide the elastic blocks 23 opposite the needles 5, 6 and 7. Moreover, in the case of the receptacle 4 having to receive a specific capsule 17, at least one polarization catch 37 may be provided.

Inside the capsule 17 is disposed a transverse wall 38, pierced with holes 39 and traversed by a tubular element 40 extending the needle 7. This transverse wall 38 delimits in the capsule 17 between itself and the bottom 25, a chamber 41 in which is injected the precipitating agent coming from the syringes 2 and 3, through needles 5 and 6.

Furthermore, between the end of the tubular element 40 and the obturator disc 21 is provided a transverse diffusion grid 42, dividing the remaining interior space of the capsule 17 between a mixing chamber 43 (between the wall 38 and said grid 42) and an intermediate chamber 44 (between the obturator disc 21 and said grid 42). The diffusion grid 42 has for its object to effect a wide uniform diffusion front on all the crucibles 18.

In this way, in the injection chamber 41 is effected a pre-mixture of precipitating agent, said mixture being completed in chamber 43. The separation wall 38, associated with the tubular element 40, has for its object to increase the distance that the precipitating agent must cover before arriving at the evacuation needle 7, in order to prevent evacuation, towards the overflow vessel 12, of the precipitating agent which is in the course of being injected via needles 5 or 6. In the intermediate chamber 44, the transitory phenomenon of modification of concentration is presented in the form of a uniform diffusion front.

FIG. 8 shows a capsule 17 which is more particularly intended for diffusion in liquid/liquid phase. The only difference of this embodiment from that of FIGS. 3 to 7 lies in that the crucibles 18 are no longer obturated by diffusion membranes 27.

Figure 9:
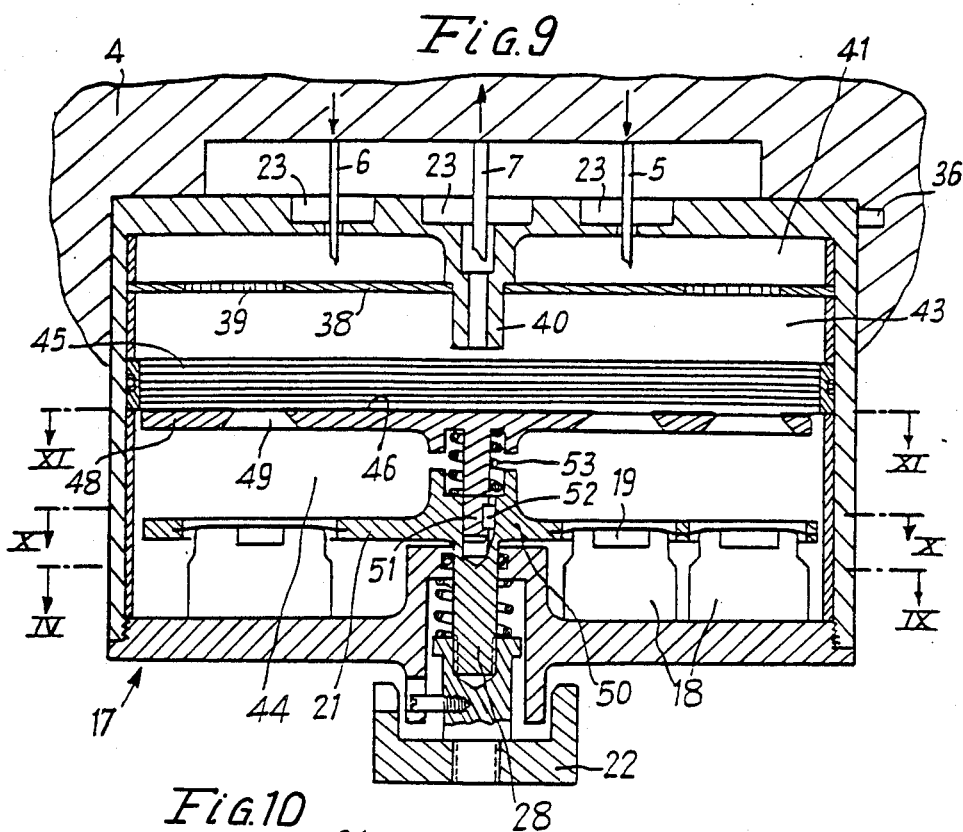
FIG. 9 shows, in axial section, an advantageous embodiment for a capsule intended for diffusion in vapour phase.
Figure 10:
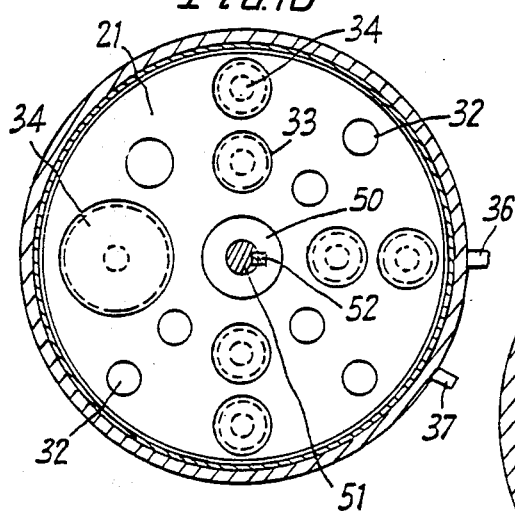
FIG. 10 is a transverse section on a reduced scale along line X—X of FIG. 9.
Figure 11:
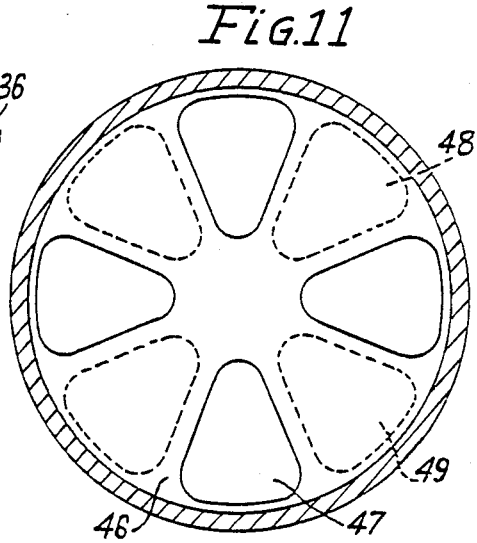
FIG. 11 is a partial transverse section, on a reduced scale, along line XI—XI of FIG. 9.

The embodiment of the capsule 17 according to the invention, shown in FIGS. 9, 10 and 11, is more especially intended for carrying out crystal growth by liquid/vapour diffusion. This embodiment is essentially similar to that illustrated in FIG. 8 for a liquid/liquid diffusion. However, in that case, the intermediate chamber 44 arranged above the obturator disc 21 is filled with a gas. In this way, in the embodiment of FIGS. 9 to 11, the diffusion grid 42 of FIGS. 3 and 8 is replaced by a retention element 45 for the liquid precipitating agent. This retention element 45 is for example a spongy body.

Moreover, in order to control filling of the intermediate chamber 44 with vapour of precipitating agent, an additional obturator system is provided (cf. likewise FIG. 11). This additional obturator system comprises for example a transverse fixed plate 46, provided with openings 47 and supporting the retention element 45, as well as a rotating disc 48 pierced with openings 49. The rotating disc 48 is applied against the transverse fixed plate 46, on the side opposite the retention element 45 and, by rotation of said disc 48, the openings 49 thereof may be guided either into register with the openings 47 of the plate 46, or in a position for which said openings 47 are obturated by the non-perforated part of the disc 48 (position of obturation shown in FIG. 11).

The control of the obturation disc 48 in rotation is preferably coupled with that of the obturator disc 21. To that end, the disc 21 may comprise a housing 50 for the shaft 51 of the disc 48, said shaft 51 being connected in rotation to the obturator disc 21 by a pin 52. A spring 53 may be provided, on the one hand, to elastically apply the rotating disc 48 against the fixed plate 46 and, on the other hand, to uncouple the discs 21 and 48, during the movement of moving apart and approach of the disc 21 with respect to the crucibles 18.

FIGS. 3 to 11 show that, whatever the process of diffusion employed, the capsules used present similar structures. These structures are such that, between the injection needles 5 and 6 and the crucibles 18, there are provided:

an injection chamber 41 in which said injection needles 5 and 6 open out;

a mixing chamber 43 into which the evacuation needle 7 opens (via the tubular element 40);

a diffusion or retention element 42 or 45, possibly associated with an additional controllable obturator 46 to 49;

an intermediate chamber 44, separated from said mixing chamber 43 by said diffusion or retention element 42 or 45; and a principal controllable obturator 21, disposed between said intermediate chamber 44 and said crucibles 18.

We claim:

1. System of crystal growth by diffusion, in which a substance to be crystallized, contained in a crucible, is brought into the presence of a precipitating agent, comprising:
   (a) at least one receptacle provided with first and second needles;
   (b) supply means for a precipitating agent and connected to said first needle;
   (c) evacuating means for said precipitating agent and connected to said second needle;
   (d) at least one removable capsule having septa and enclosing at least one crucible for receiving a precipitating agent and a substance to be crystallized, said capsule being introduced into said receptacle in such a way that said first and second needles perforate said septa such that said supplying and evacuating means are so connected to the interior of said capsule via said first and second needles;
   (e) a removable plug introduced into said receptacle in place of said capsule, said plug comprising a septa and a spongy body imbibed with precipitating agent, said septa and spongy body pierced by said first and second needles; and
   (f) a first controllable obturator provided inside said capsule to selectively obturate said crucible to isolate contents from an interior cavity of said capsule, or to open said crucible and place the contents in communication with the cavity of the capsule.

2. System of crystal growth according to claim 1, wherein said means for supplying precipitating agent comprises at least one syringe.

3. System of crystal growth according to claim 1, wherein non-return valves are provided in said means for supplying precipitating agent.

4. System of crystal growth according to claim 1, wherein said means for evacuating precipitating agent comprises an expansion vessel.

5. System of crystal growth according to claim 1, wherein said first controllable obturator is a perforated disc mounted to rotate about a shaft accessible from outside said capsule.

6. System of crystal growth according to claim 5, wherein the shaft of said rotating disc is slidable in a limited manner, parallel to its axis, so that said disc is moved away from the crucible during passage of the disc from a position of obturation to an open position.

7. System of crystal growth according to claim 1, wherein at least a part of the first obturator coming into contact with the crucible in a position of obturation is constituted by a supple membrane.

8. System of crystal growth according to claim 1, wherein a separating wall is provided within said capsule to separate said first needles connected to said supply means for the precipitating agent from said second needle connected to said evacuating means when said capsule is introduced into said receptacle.

9. System of crystal growth according to claim 1, wherein a diffusion surface is provided within the capsule, to separate, said first and second needles connected to said means for supplying and evacuating precipitating agent and said crucible when said capsule is introduced into said receptacle.

10. System of crystal growth according to claim 9, wherein an intermediate chamber is provided between said diffusion surface and said first controllable obturator.

11. System of crystal growth according to claim 1, intended for vapor phase diffusion, wherein an element for retention of precipitating agent is provided within said capsule, between said septa and said crucible.

12. System of crystal growth according to claim 11, wherein a second controllable obturator is associated with said retention element.

13. System of crystal growth according to claim 12, wherein said first and second controllable obturators are coupled in rotation.

14. System of crystal growth according to claim 11, wherein an intermediate chamber is provided between said second obturator and said first controllable obturator.

15. System of crystal growth according to claim 1, wherein said capsule and said receptacle comprise cooperating indexing or polarizing means.

16. System of crystal growth according to claim 11, wherein an intermediate chamber is provided between said retention element and said first controllable obturator.

17. A device for producing crystals comprising
(a) a sealed casule having septa and enclosing at least one crucible for receiving a precipitating agent and a substance to be crystallized,
(b) a receptacle for receiving said capsule, said receptacle including a precipitating agent supply means connected to a first needle and a precipitating agent evacuation means connected to a second needle,
(c) a plug including septa and a sponge-like body imbibed with a precipitating agent, wherein said plug is removably received by said receptacle, and the first and second needles pierce the septa of the receptacle and penetrate the sponge-like body whereby the needles are continuously bathed by the precipitating agent in the sponge-like body to substantially prevent contamination of the needles, and
(d) a closure member to selectively open and close the crucible when the capsule is received by the receptacle,
wherein said capsule is receivable by said receptacle and the needles of the receptacle pierce the septa of the capsule to communicate the interior of the capsule to the supply of precipitating agent and the evacuating means.

18. The device of claim 17, wherein the capsule further includes an actuator on an outer surface of the capsule to selectively operate the closure member.

* * * * *